United States Patent
Ishikura

(10) Patent No.: US 10,830,822 B2
(45) Date of Patent: Nov. 10, 2020

(54) POWER STORAGE SYSTEM

(71) Applicant: TOYOTA JIDOSHA KABUSHIKI KAISHA, Toyota (JP)

(72) Inventor: Makoto Ishikura, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 276 days.

(21) Appl. No.: 15/835,562

(22) Filed: Dec. 8, 2017

(65) Prior Publication Data

US 2018/0172776 A1 Jun. 21, 2018

(30) Foreign Application Priority Data

Dec. 19, 2016 (JP) .................................. 2016-245361

(51) Int. Cl.
| | |
|---|---|
| G01R 31/367 | (2019.01) |
| H02J 7/00 | (2006.01) |
| G01R 31/396 | (2019.01) |
| G01R 31/3842 | (2019.01) |
| G01R 31/392 | (2019.01) |

(52) U.S. Cl.
CPC ....... G01R 31/367 (2019.01); G01R 31/3842 (2019.01); G01R 31/396 (2019.01); H02J 7/0047 (2013.01); G01R 31/392 (2019.01); H02J 7/0048 (2020.01)

(58) Field of Classification Search
CPC ................ G01R 31/367; G01R 31/396; G01R 31/3842; G01R 31/392; G01R 31/388; H02J 7/0047; H02J 2007/005; H01M 10/425; H01M 10/482; H01M 2010/4271
See application file for complete search history.

(56) References Cited

U.S. PATENT DOCUMENTS

| | | | | |
|---|---|---|---|---|
| 2002/0195999 | A1* | 12/2002 | Kimura | B60L 58/12 320/134 |
| 2010/0253149 | A1 | 10/2010 | Iida et al. | |
| 2015/0084639 | A1* | 3/2015 | Joe | B60L 58/12 324/428 |
| 2017/0261561 | A1* | 9/2017 | Imamura | H01M 10/48 |

FOREIGN PATENT DOCUMENTS

| | | |
|---|---|---|
| CN | 101809802 A | 8/2010 |
| CN | 104541175 A | 4/2015 |
| JP | 2013-102563 A | 5/2013 |
| JP | 2015-061505 A | 3/2015 |
| JP | 2016-019419 A | 2/2016 |

* cited by examiner

*Primary Examiner* — Akm Zakaria
(74) *Attorney, Agent, or Firm* — Sughrue Mion, PLLC

(57) ABSTRACT

A power storage system includes a power storage device including cells connected in parallel with each other; a voltage sensor; a current sensor; a data acquisition unit configured to acquire voltage-current data sets; a linear approximation processing unit configured to perform first-order linear approximation on the acquired voltage-current data sets using a function form, Y=aX+b where Y denotes a voltage between terminals of the power storage device at a time of charging/discharging and X denotes a charge/discharge current, and to obtain constants a, b and a ratio b/a between the constants; and a determination unit configured to determine that variation in SOC has not occurred among the cells when the ratio b/a is within a prescribed constant ratio range, and to determine that the variation in SOC has occurred among the cells when the ratio b/a is not within the prescribed constant ratio range.

3 Claims, 1 Drawing Sheet

POWER STORAGE SYSTEM

INCORPORATION BY REFERENCE

The disclosure of Japanese Patent Application No. 2016-245361 filed on Dec. 19, 2016 including the specification, drawings and abstract is incorporated herein by reference in its entirety.

BACKGROUND

1. Technical Field

The present disclosure relates to a power storage system, and more particularly, to a power storage system that includes a power storage device including a plurality of cells connected in parallel with each other.

2. Description of Related Art

A desired large current can be output by connecting a plurality of cells, whose output current is small, in parallel with each other to constitute a single power storage device. When states of charge (SOC) of the plurality of cells connected in parallel with each other are different from each other, one or some of the cells are emptily or fully charged first at the time of charging, and thus, the charge/discharge characteristics of the entire power storage device deteriorate. Thus, charge/discharge control for the power storage device needs to be performed after determining whether variation in SOC has occurred among the cells.

For example, Japanese Patent Application Publication No. 2013-102563 (JP 2013-102563 A) describes a power storage device that is configured by connecting a plurality of sets of cells and SOC adjustment means in parallel with each other. The cell and the SOC adjustment means in each of the sets are connected in series with each other. Charge/discharge control is performed in accordance with aging characteristics of the cells, in the power storage device. The SOC of each of the cells is obtained based on a charge/discharge current integrated value regarding each of the cells and an open circuit voltage (OCV) regarding each of the cells.

As a technology related to the present disclosure, the following is described in Japanese Patent Application Publication No. 2016-019419 (JP 2016-019419 A). In a module that is configured by connecting a plurality of cells in series with each other, the cell voltages of the cells are acquired by respective voltage sensors, in order to confine the range of variation in the cell voltage in the entire module within a prescribed range. Further, Japanese Patent Application Publication No. 2015-061505 (JP 2015-061505) describes a power storage device that is configured by connecting a plurality of power storage blocks in series with each other, each of the power storage blocks being obtained by connecting a plurality of cells in parallel with each other. In the power storage device, amounts of change in SOC of the power storage blocks are compared with each other, in order to determine whether a current path of at least one of the cells is interrupted.

SUMMARY

In order to determine whether there is variation in SOC among the plurality of cells connected in parallel with each other, the cells are provided with current sensors respectively, an SOC of each of the cells is obtained based on an integrated value of a charge/discharge current, and the values of SOC of the cells are compared with each other. In the case of the plurality of cells connected in parallel with each other, voltages of all the cells can be detected by a single voltage sensor. Thus, in order to determine whether there is variation in SOC among the plurality of cells connected in parallel with each other, the same number of current sensors as the number of cells are required, and thus, the size of the power storage device increases, accordingly, cost increases. Thus, there have been demands for a power storage system that makes it possible to determine whether there is variation in SOC among cells, with the use of the minimum number of current sensors.

The applicant examined the possibility of determining whether there is variation in SOC among cells using only the current and voltage of a power storage device that is configured by connecting a plurality of cells in parallel with each other, without using the currents of the cells. Thus, the applicant applied a relational expression among a closed circuit voltage (CCV) as a voltage between terminals at the time when a charge/discharge current I is caused to flow, an open circuit voltage (OCV), an internal resistance R of a battery, and the charge/discharge current I to a case where the cells are connected in parallel with each other, and the applicant carried out analysis. As a result, the applicant found that it can be determined, with the use of a single current sensor and a single voltage sensor, whether there is variation in SOC among the cells. The following disclosure is based on this finding.

A power storage system according to an aspect of the disclosure includes a power storage device including a plurality of cells connected in parallel with each other; a voltage sensor configured to detect a voltage between terminals of the power storage device; a current sensor configured to detect a charge/discharge current flowing between the terminals of the power storage device; a data acquisition unit configured to simultaneously acquire a detection value obtained by the voltage sensor and a detection value obtained by the current sensor at each of a plurality of detection timings within a prescribed determination time range, and to acquire a plurality of voltage-current data sets; a linear approximation processing unit configured to perform first-order linear approximation on the acquired plurality of voltage-current data sets with use of a function form, $Y=aX+b$ where Y denotes the voltage between the terminals of the power storage device at a time of charging/discharging and X denotes the charge/discharge current, and to obtain constants a, b and a ratio b/a between the constants; and a determination unit configured to compare the obtained ratio b/a between the constants with a prescribed constant ratio range, to determine that variation in a state of charge has not occurred among the plurality of cells when the obtained ratio b/a between the constants is within the prescribed constant ratio range, and to determine that the variation in the state of charge has occurred among the plurality of cells when the obtained ratio b/a between the constants is not within the prescribed constant ratio range.

In the power storage system according to the present disclosure, the determination unit may be configured to set the prescribed constant ratio range to a range obtained by adding an estimation error range to OCV/a where OCV denotes an open circuit voltage of the power storage device, the open circuit voltage being the voltage between the terminals of the power storage device at a time when the charge/discharge current is equal to zero.

In the power storage system according to the present disclosure, the data acquisition unit may be configured to set the prescribed determination time range to a time range in which change in the state of charge of each of the plurality of cells remains within a prescribed change range.

The power storage system according to the above-described aspect makes it possible to determine whether there is variation in SOC among the cells, with the use of the single voltage sensor and the single current sensor.

BRIEF DESCRIPTION OF THE DRAWINGS

Features, advantages, and technical and industrial significance of an exemplary embodiment of the disclosure will be described below with reference to the accompanying drawings, in which like numerals denote like elements, and wherein.

DETAILED DESCRIPTION OF EMBODIMENT

An embodiment of the disclosure will be described hereinafter in detail, using the drawings. In the following, the number of cells and the like are exemplified for the sake of illustration, and can be appropriately changed in accordance with the specifications of a power storage system. In the following, like elements are denoted by like reference signs and numerals in all the drawings, and redundant description is omitted.

Figure 1:
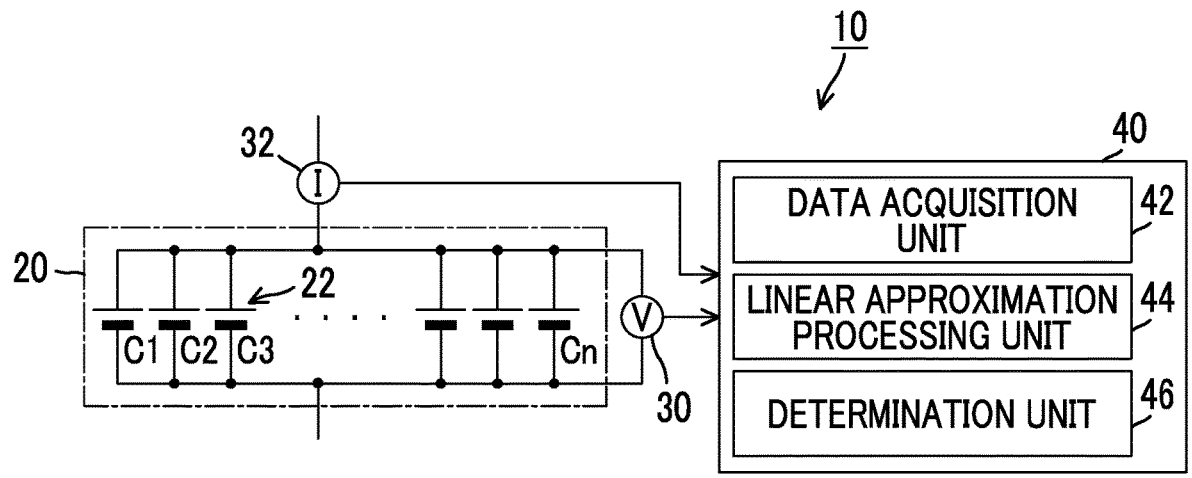
FIG. 1 is a configuration diagram of a power storage system according to an embodiment.

FIG. 1 is a configuration diagram of a power storage system 10. The power storage system 10 includes a power storage device 20 including a plurality of cells 22 connected in parallel with each other, and one voltage sensor (a single voltage sensor) 30 configured to detect a voltage V between terminals of the power storage device 20. Furthermore, the power storage system 10 includes one current sensor (a single current sensor) 32 configured to detect a charge/discharge current I flowing between both the terminals of the power storage device 20, and a determination control device 40 configured to determine whether there is variation in a State of Charge (SOC) among the plurality of cells 22.

The power storage device 20 is an assembled battery that includes the plurality of cells 22 connected in parallel with each other. A high voltage can be output by connecting a plurality of power storage devices 20 in series with each other. A large current and a high voltage can be output by further connecting the plurality of power storage devices 20 in parallel with each other. For example, therefore, the power storage devices 20 can be mounted in a vehicle, and can be used for a power supply or the like for a rotating electrical machine for driving the vehicle. This is an example of the purpose of use of the power storage device 20. The power storage device 20 may be used for purposes other than the purpose of being mounted in the vehicle.

In FIG. 1, the number of cells 22 that are connected in parallel with each other is denoted by n. For example, n=15. This is an example, and thus, n may be another number other than 15. Each of the cells 22 is a rechargeable secondary battery. A lithium-ion cell, a nickel hydride cell or the like is used as each of the cells 22. Each of the cells 22 may be a secondary battery other than the above-described cells. For example, each of the cells 22 may be a lead storage battery or a capacitor.

The voltage sensor 30 is a voltage detection device configured to detect a voltage V between the terminals of the power storage device 20. One voltage sensor 30 is used for one power storage device 20. When the charge/discharge current I flows through the power storage device 20, the voltage sensor 30 detects a closed circuit voltage (CCV) of the power storage device 20. When the charge/discharge current I does not flow through the power storage device 20, the voltage sensor 30 detects an open circuit voltage (OCV) of the power storage device 20.

The determination control device 40 includes a data acquisition unit 42, a linear approximation processing unit 44, and a determination unit 46. An appropriate computer can be used as the determination control device 40. For example, when the power storage device 20 is mounted in the vehicle, a computer that is suited to be mounted in the vehicle can be used. In this case, the determination control device 40 may be an independent device, and may be a part of another control device that is mounted in the vehicle depending on the circumstances. For example, the determination control device 40 may be a part of an integrated control device for the vehicle. In other words, the determination control device 40 may be a computer system (i.e., an Electronic Control Unit (ECU)) that includes a Central processing unit (CPU), a Read-only memory (ROM), a Random access memory (RAM), and an input-output interface.

The data acquisition unit 42 of the determination control device 40 simultaneously acquires a detection value obtained by the voltage sensor 30 and a detection value obtained by the current sensor 32 at each of a plurality of detection timings within a prescribed determination time range, and thus acquires a plurality of voltage-current data sets. The linear approximation processing unit 44 performs first-order linear approximation on the acquired plurality of voltage-current data sets with the use of a function form, $Y=aX+b$ where Y denotes the voltage between the terminals of the power storage device 20 at the time of charging/discharging and X denotes a charge/discharge current, and thus, the linear approximation processing unit 44 obtains constants a, b and a ratio (b/a) between the two constants. The determination unit 46 compares the obtained ratio (b/a) between the constants with a prescribed constant ratio range. When the obtained ratio (b/a) between the constants is within the prescribed constant ratio range, the determination unit 46 determines that variation in the state of charge has not occurred among the plurality of cells 22. When the obtained ratio (b/a) between the constants is not within the prescribed constant ratio range, the determination unit 46 determines that the variation in the state of charge has occurred among the plurality of cells 22.

This function is implemented through the execution of software that is mounted in the determination control device 40. More specifically, this function can be implemented through the execution of an SOC variation detection program as software by the determination control device 40. A part of this function may be implemented by hardware.

The operation and effects of the above-described configuration, especially functions of the determination control device 40 will be described in detail, with reference to a model diagram of FIG. 2. In other words, a principle that makes it possible to determine whether there is variation in SOC among the cells 22 with the use of the single voltage sensor 30 and the single current sensor 32 will be described in detail, with reference to a model diagram of FIG. 2.

Figure 2:
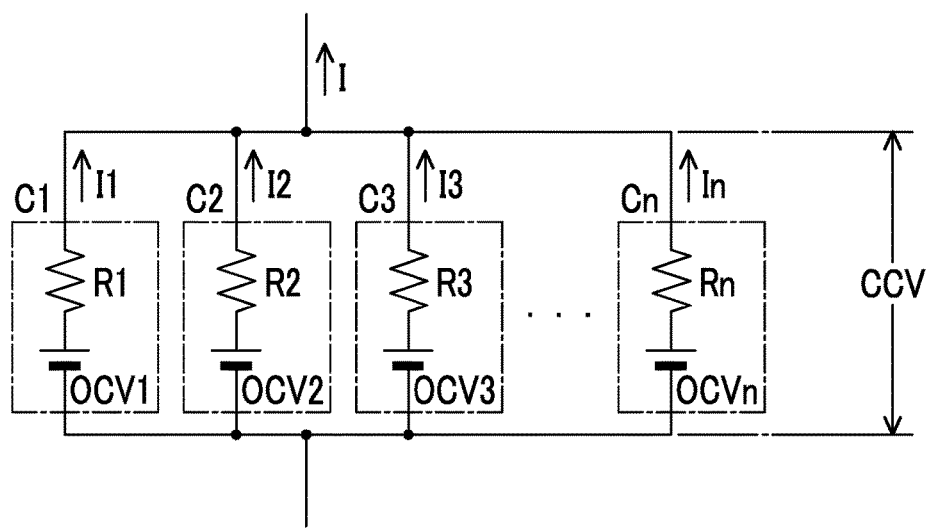
FIG. 2 is a diagram showing a modeled power storage device.

FIG. 2 is a diagram showing a modeled state of the cells 22 when the voltage V between the terminals of the power storage device 20 and the charge/discharge current I of the power storage device 20 are acquired. The voltage V between the terminals of the power storage device 20 is CCV when the charge/discharge current I flows. In FIG. 2, C1 to Cn denote the cells 22 respectively, when n denotes the number of cells that are connected in parallel with each other. Each of OCV1 to OCVn denotes the OCV of the corresponding cell 22. Each of I1 to In denotes the charge/discharge current flowing through the corresponding cell 22. Each of R1 to Rn denotes the internal resistance of the corresponding cell 22.

In the power storage device 20 in which the cells 22 are connected in parallel with each other, when internal resistances Rn of the respective cells 22 are different from each other, charge/discharge currents In flowing through the respective cells 22 are also different from each other. A voltage between terminals of each of the cells 22 at the time when the charge/discharge current In flows through the cell 22 is denoted by CCVn. The voltage between the terminals of each of the cells 22 at the time when the charge/discharge current In does not flow through the cell 22 is an open circuit voltage OCVn of the cell 22. Therefore, with regard to each of the cells 22, an expression, CCVn=(OCVn−RnIn) is established. It should be noted herein that the cells 22 are connected in parallel with each other. Therefore, the voltages CCVn of all the cells 22 are equal to each other, and are equal to the voltage CCV between the terminals of the power storage device 20. As a result, an expression (1) is established.

$$CCV = OCV_n - R_n \cdot I_n \tag{1}$$

When the cells 22 are connected in parallel with each other, the sum of the charge/discharge currents In of the cells 22 is equal to the charge/discharge current of the power storage device 20. Therefore, an expression (2) is established.

$$I = \Sigma I_n \tag{2}$$

The expression (1) is transformed to In=−(CCV/Rn)+(OCVn/Rn). When calculation is carried out according to the expression (2) through the use of the expression obtained by transforming the expression (1), an expression (3) is obtained.

$$CCV = -\frac{1}{\sum \frac{1}{R_n}} \cdot I + \frac{\sum \frac{OCV_n}{R_n}}{\sum \frac{1}{R_n}} \tag{3}$$

In the power storage device 20, CCV is detected by the single voltage sensor 30, and the charge/discharge current I is detected by the single current sensor 32. Then, a detection value of CCV obtained by the voltage sensor 30 and a detection value of I obtained by the current sensor 32 are simultaneously acquired at each of a plurality of detection timings within the prescribed determination time range. A plurality of acquired data sets (CCV, I) is regarded as a plurality of voltage-current data sets. This processing procedure is carried out by the function of the data acquisition unit 42 of the determination control device 40.

The data acquisition unit 42 sets the prescribed determination time range to a time range in which change in the state of charge (SOC) remains within a prescribed change range when the plurality of cells 22 as a whole is regarded as one battery. That is, the plurality of voltage-current sets needs to be acquired within the prescribed determination time range. For instance, when the range of change in SOC that can be permitted to determine whether there is variation in SOC among the cells 22 is a range equal to or smaller than 1%, ampere hours (Ah) corresponding to 1% of full charge capacities of the respective cells 22 are obtained. Then, a time range in which the range of change in SOC remains within a range equal to or less than 1% is determined by regarding the sum of the obtained ampere hours (Ah) of all the cells 22 as a time integral value (Ah) of the charge/discharge current I during traveling of the vehicle, and then, the prescribed determination time range is set to the determined time range. This is an example for the sake of illustration. Alternatively, the determination time range may be set through experiment, simulation or the like.

A relationship between CCV and I is estimated with the use of the acquired plurality of voltage-current data sets. CCV and I of the power storage device 20 are subjected to first-order linear approximation according to an expression (4).

$$CCV = a \cdot I + b \tag{4}$$

The least-square method can be used as a method of calculating two constants a, b in the approximate expression, namely, the expression (4) from the plurality of (CCV, I) data sets as the plurality of voltage-current data sets. Alternatively, the regression analysis method or the like may be used. This processing procedure is carried out by the function of the linear approximation processing unit 44 of the determination control device 40.

The two constants a, b are expressed by expressions (5) and (6) respectively, by comparing the expressions (3) and (4) with each other.

$$a = -\frac{1}{\sum \frac{1}{R_n}} \tag{5}$$

$$b = \frac{\sum \frac{OCV_n}{R_n}}{\sum \frac{1}{R_n}} \tag{6}$$

An expression (7) regarding a ratio between the two constants is obtained from the expressions (5) and (6).

$$-\frac{b}{a} = \sum \frac{OCV_n}{R_n} \tag{7}$$

When the open circuit voltages OCVn of all the plurality of cells 22 are assumed to be equal to each other, the open circuit voltage OCV of the power storage device 20 is equal to the open circuit voltage OCVn of each of the cells 22. That is, when the above-described assumption is considered to be correct, an expression (8) is established.

$$OCV = OCV_n \tag{8}$$

When the expression (8) is assigned to the expression (7) on the premise that the above-described assumption is correct, an expression (9) is obtained.

$$-\frac{b}{a} = OCV \cdot \sum \frac{1}{R_n} \tag{9}$$

When the expression (5) is assigned to the expression (9), an expression (10) is obtained.

$$-\frac{b}{a} = -\frac{OCV}{a} \quad (10)$$

In the right side of the expression (10), the OCV of the power storage device 20 can be estimated. For example, the SOC of the power storage device 20 can be obtained by integrating the charge/discharge current I acquired moment by moment by the current sensor 32. A relationship between SOC and OCV is obtained in advance through experiment or simulation. The SOC of the power storage device 20 that is mounted in the vehicle is monitored such that charging/discharging is carried out within an appropriate SOC range while overdischarge and overcharge are avoided. Therefore, the SOC and OCV of the power storage device 20 can be also estimated based on the monitored data. Further, in the right side of the expression (10), the constant a is a value calculated from the plurality of data sets (the voltage CCV, the charge/discharge current I) through the use of the least-square method.

Accordingly, it can be determined whether there is variation in SOC among the cells 22, based on whether a ratio $\{-(b/a)\}$ between the two constants obtained according to the expression (4) through the first-order linear approximation coincides with the value of the right side of the expression (10), the value being a prescribed value that is obtained through estimation and calculation. That is, when the ratio $\{-(b/a)\}$ between the two constants obtained through the first-order linear approximation does not coincide with the value of the right side of the expression (10) as the prescribed value, the above-described assumption is incorrect, and the values OCVn of the cells 22 are not equal to each other. OCV and SOC are closely related to each other as described above. Therefore, when the values OCVn of the cells 22 are not equal to each other, there is variation in SOC among the cells 22. When the ratio $\{-(b/a)\}$ between the two constants obtained through the first-order linear approximation coincides with the value of the right side of the expression (10) as the prescribed value, the above-described assumption is correct, the values OCVn of the cells 22 are equal to each other, and there is not the variation in SOC among the cells 22.

The ratio $\{-(b/a)\}$ between the two constants obtained through the first-order linear approximation has an error such as detection variation, and the value of the right side of the expression (10) as the prescribed value also includes a calculation error, an estimation error, or the like. Accordingly, the prescribed constant ratio range is set to a range obtained by adding an estimation error range to the value of the right side of the expression (10) as the prescribed value, and the obtained ratio $\{-(b/a)\}$ between the constants is compared with the prescribed constant ratio range. When the obtained ratio $\{-(b/a)\}$ between the constants is within the prescribed constant ratio range as a result of the comparison, it is determined that variation in the state of charge has not occurred among the plurality of cells. When the obtained ratio $\{-(b/a)\}$ between the constants is not within the prescribed constant ratio range, it is determined that variation in the state of charge has occurred among the plurality of cells. In the case where the comparison is made, the same result is obtained when the negative sign is shifted to the prescribed constant ratio range, the ratio between the two constants is simply regarded as (b/a), and these values are compared with each other. Further, the same result is obtained when the values a on the both sides are deleted and it is determined whether an expression, b=OCV is correct or incorrect. This processing procedure is carried out by the function of the determination unit 46 of the determination control device 40.

The power storage system 10 according to the present embodiment includes the power storage device 20 including the plurality of cells 22 connected in parallel with each other. The power storage system 10 includes the single voltage sensor 30 that detects the voltage between the terminals of the power storage device 20, and the single current sensor 32 that detects the charge/discharge current flowing between both the terminals of the power storage device 20. The power storage system 10 includes the data acquisition unit 42, the linear approximation processing unit 44, and the determination unit 46, as the determination control device 40. The data acquisition unit 42 simultaneously acquires the detection value obtained by the voltage sensor and the detection value obtained by the current sensor at each of a plurality of detection timings within the prescribed determination time range, and acquires the plurality of voltage-current data sets. The linear approximation processing unit 44 performs first-order linear approximation on the acquired plurality of voltage-current data sets with the use of the function form, Y=aX+b where Y denotes the voltage between the terminals of the power storage device 20 at the time of charging/discharging and X denotes the charge/discharge current, and thus, the linear approximation processing unit 44 obtains the constants a, b and the ratio (b/a) between the two constants. The determination unit 46 compares the obtained ratio (b/a) between the constants with the prescribed constant ratio range. When the obtained ratio (b/a) between the constants is within the prescribed constant ratio range as a result of the comparison, the determination unit 46 determines that variation in the state of charge has not occurred among the plurality of cells. When the obtained ratio (b/a) between the constants is not within the prescribed constant ratio range as a result of the comparison, it is determined that the variation in the state of charge has occurred among the plurality of cells.

In the power storage system 10 according to the above-described configuration, it is possible to determine whether there is variation in the SOC among the cells 22, with the use of the single voltage sensor 30 and the single current sensor 32.

What is claimed is:

1. A power storage system comprising:
   a power storage device including a plurality of cells connected in parallel with each other;
   a single voltage sensor configured to detect a closed circuit voltage between terminals of the power storage device;
   a single current sensor configured to detect a charge or discharge current flowing between the terminals of the power storage device; and
   a computer system comprising:
      a data acquisition unit configured to simultaneously acquire the closed circuit voltage and the charge or discharge current that are respectively detected by the single voltage sensor and the single current sensor at each of a plurality of detection timings within a prescribed determination time range, to acquire a plurality of closed circuit voltage-current data sets;
      a linear approximation processing unit configured to perform first-order linear approximation on the acquired plurality of closed circuit voltage-current data sets to obtain a linear function of Y=aX+b, wherein Y denotes the closed circuit voltage between the terminals of the power storage device at a time of charging or discharging, X denotes the charge or discharge current, and a and b denote constants; and a determination unit configured to compare a ratio between a and b of the linear function with a prescribed constant ratio range, and as a prerequisite for performing charge or discharge control for the power storage device, determine whether variation in a state of charge has occurred among the plurality of cells based on a result of comparing the ratio between a and b of the linear function with the prescribed constant ratio range.

2. The power storage system according to claim 1, wherein the determination unit is configured to set the prescribed constant ratio range to a range obtained by adding an estimation error range to OCV/a where OCV denotes an open circuit voltage of the power storage device that is measured at a time when the charge or discharge current is equal to zero.

3. The power storage system according to claim 1, wherein the data acquisition unit is configured to set the prescribed determination time range to a time range in which change in the state of charge of each of the plurality of cells remains within a prescribed change range.

* * * * *